United States Patent
Sato et al.

(10) Patent No.: US 8,102,500 B2
(45) Date of Patent: Jan. 24, 2012

(54) STAGE DEVICE, EXPOSURE APPARATUS, AND MICRODEVICE MANUFACTURING METHOD

(75) Inventors: Hitoshi Sato, Utsunomiya (JP); Yasuhito Sasaki, Utsunomiya (JP); Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 334 days.

(21) Appl. No.: 11/751,225

(22) Filed: May 21, 2007

(65) Prior Publication Data

US 2007/0273861 A1    Nov. 29, 2007

(30) Foreign Application Priority Data

May 26, 2006  (JP) .................................. 2006-147169
Mar. 8, 2007  (JP) .................................. 2007-058713

(51) Int. Cl.
G03B 27/32 (2006.01)
G03B 27/42 (2006.01)
G03B 27/52 (2006.01)
G03B 27/58 (2006.01)
G03B 27/62 (2006.01)
H01B 7/295 (2006.01)
H02K 41/02 (2006.01)

(52) U.S. Cl. ................... 355/30; 174/110 R; 310/12.06; 310/12.29; 355/53; 355/72; 355/75; 355/77

(58) Field of Classification Search ...................... 355/30, 355/53, 72, 75, 77; 318/649; 62/264, 304; 310/12, 12.01, 12.29, 12.05–12.06; 174/110 R–110 E See application file for complete search history.

(56) References Cited

U.S. PATENT DOCUMENTS

| | | | |
|---|---|---|---|
| 6,226,073 B1 | 5/2001 | Emoto | 355/53 |
| 6,333,777 B1 | 12/2001 | Sato | 355/53 |
| 6,339,467 B1 | 1/2002 | Sato | 355/77 |
| 6,509,951 B2 | 1/2003 | Loopstra et al. | 355/30 |
| 6,552,773 B2 | 4/2003 | Emoto | 355/53 |
| 6,657,204 B2 | 12/2003 | Buis et al. | 250/398 |

(Continued)

FOREIGN PATENT DOCUMENTS

JP        11-214298       8/1999

(Continued)

OTHER PUBLICATIONS

Official Letter dated May 27, 2009, issued in corresponding Korean patent application No. 10-2007-0050109.

(Continued)

*Primary Examiner* — Hung Henry Nguyen
*Assistant Examiner* — Colin Kreutzer
(74) *Attorney, Agent, or Firm* — Fitzpatrick, Cella, Harper & Scinto

(57) ABSTRACT

A stage device includes a base, and a stage movable portion being movable along a surface of the base. An interferometer measures a position of the stage movable portion, and at least one of a piping element and a wiring element is connected to the stage movable portion. An auxiliary member holds the piping element or the wiring element. The auxiliary member surrounds at least a portion of the piping element or the wiring element and is flexible, to be bent in accordance with the bending of the piping element or the wiring element, and a heat insulating material, held by the auxiliary member, reduces heat to be transferred from the piping element or the wiring element to a space through which measurement light of the interferometer passes.

13 Claims, 11 Drawing Sheets

U.S. PATENT DOCUMENTS

| | | | |
|---|---|---|---|
| 6,810,298 B2 | 10/2004 | Emoto | 700/121 |
| 6,915,179 B2 * | 7/2005 | Emoto | 700/121 |
| 6,954,258 B2 * | 10/2005 | Emoto | 355/72 |
| 7,012,690 B2 | 3/2006 | Akutsu et al. | 356/400 |
| 7,038,759 B2 | 5/2006 | Emoto et al. | 355/30 |
| 7,057,313 B2 | 6/2006 | Buis et al. | 310/12 |
| 7,057,703 B2 | 6/2006 | Emoto et al. | 355/30 |
| 7,064,804 B2 | 6/2006 | Emoto | 355/30 |
| 7,158,232 B2 | 1/2007 | Akutsu et al. | 356/400 |
| 7,177,007 B2 | 2/2007 | Emoto | 355/30 |
| 2002/0070699 A1 * | 6/2002 | Tanaka et al. | 318/687 |
| 2003/0137643 A1 * | 7/2003 | Jacobs et al. | 355/53 |
| 2004/0079898 A1 | 4/2004 | Buis et al. | 250/492.2 |
| 2005/0007575 A1 | 1/2005 | Miyajima | |
| 2005/0052143 A1 * | 3/2005 | Ohishi | 318/135 |
| 2005/0092013 A1 | 5/2005 | Emoto | 62/304 |
| 2005/0128444 A1 * | 6/2005 | Ottens et al. | 355/30 |
| 2005/0132962 A1 | 6/2005 | Emoto | 118/729 |
| 2005/0151945 A1 * | 7/2005 | Van Der Schoot et al. | 355/53 |
| 2005/0219501 A1 | 10/2005 | Sato et al. | 355/72 |
| 2006/0028629 A1 | 2/2006 | Emoto et al. | 355/30 |
| 2006/0220478 A1 | 10/2006 | Emoto | 310/58 |
| 2007/0229787 A1 | 10/2007 | Emoto | 355/53 |

FOREIGN PATENT DOCUMENTS

| | | |
|---|---|---|
| JP | 2000-216079 | 8/2000 |
| JP | 2003-022949 | 1/2003 |
| JP | 2003-037153 | 2/2003 |
| JP | 2005-032817 | 2/2005 |
| KR | 2001-0082053 | 8/2001 |

OTHER PUBLICATIONS

Korean Office Action dated Aug. 25, 2008, issued in corresponding Korean patent application No. 10-2007-0050109.

Taiwan Office Action dated Aug. 18, 2011, issued in counterpart Taiwan patent application No. 096117918, with an English translation.

* cited by examiner

STAGE DEVICE, EXPOSURE APPARATUS, AND MICRODEVICE MANUFACTURING METHOD

This application claims priority from Japanese Patent Application No. 2006-147169, filed May 26, 2006, and Japanese Patent Application No. 2007-058713, filed Mar. 8, 2007, which are hereby incorporated by reference.

FIELD OF THE INVENTION AND RELATED ART

This invention relates to a stage device. In another aspect, the invention concerns an exposure apparatus having such a stage device for moving a reticle or a wafer, and a microdevice manufacturing method using such an exposure apparatus.

As a precision positioning device to be used in an exposure apparatus, flat or plane motor stages capable of performing precise positioning, at least with respect to a planar direction, without using a guide in that planar direction, have been investigated. Such stage devices generally use an interferometer measuring system for high-resolution and high-precision position measurement. On the other hand, these plane motor type stages are equipped with a large number of mounting parts, such as wiring elements (wires or cables) and piping elements (pipes or tubes), which are disposed adjacent to a movable portion of the stage. These mounting parts flexibly connect the stage movable portion with a stationary portion of the stage, such as a stage base, for example, by use of an auxiliary member called a "Cableveyor" (trademark). Typical examples of such mounting parts are power cables and control cables for a driving unit, signal cables for transmitting outputs of various sensors, coolant tubes for temperature control of the driving unit, and tubes for supplying compressed air to various bearing units.

Japanese Laid-Open Patent Application No. 2003-37153 and No. 2006-32817 are prior art examples that disclose a structure in which such an auxiliary member is used to set the mounting parts at a stage of an exposure apparatus.

Most of the mounting parts used at the stage movable portion and most of the mounting parts extending between the stage movable portion and the stage stationary portion produce heat or a rise in temperature. In the case of driving power cables, the wire itself generates heat in response to the flow of driving current, and it results in a temperature rise. In the case of coolant tubes, a coolant having collected the heat from the driving unit flows therethrough and, as a result, the temperature thereof is raised by it. Thus, the tube temperature increases in accordance with the heat generated at the driving unit. In some cases, from the standpoint of cooling efficiency of the driving unit, a coolant, having a temperature lower than the reference temperature set with respect to the stage, is used. On that occasion, the temperature of the coolant tube decreases, following it.

In order to meet a recent requirement of further increases of throughput (productivity) of exposure apparatuses, the acceleration and speed of the stage have risen more and more. Hence, not only heat generation at the driving unit itself, but also, any temperature change of such mounting parts, as described above, should be addressed.

The temperature change of these mounting parts will cause thermal deformation of the stage structure or degradation of measurement precision of the interferometer for measuring the stage position, and will obstruct further improvements of the stage positioning precision and exposure precision. Particularly, in the case of plane-motor stages, it is highly possible that the measurement optical axis of the interferometer is disposed quite close to the auxiliary member used to set the mounting parts. This means that any temperature change of the mounting parts may directly cause a change in the temperature adjacent to the measurement optical axis, that is, a change in the refractive index of the air. This necessarily causes a change in optical distance of the measurement optical axis. Since it cannot be distinguished from a case wherein the distance is physically changed, the result is an output of a measurement error. In order to avoid this, it is required that any temperature change of the mounting parts set by the auxiliary member does not cause a temperature change adjacent to the measurement optical axis of the interferometer.

Furthermore, the temperature change of the mounting parts placed at the stage movable portion will warm up or cool down the gas around the mounting parts, and the gas thus having its temperature changed will drift around the stage movable portion. Such gas will cause a measurement error in relation to the measurement optical axis of the interferometer disposed adjacent to the stage movable portion. Namely, with regard to the temperature change of the mounting parts placed at the stage movable portion as well, it is required that such a temperature change does not cause a temperature change around the measurement optical axis defined adjacent to the stage movable portion.

SUMMARY OF THE INVENTION

The present invention in one aspect thereof reduces the measurement error of an interferometer due to a temperature change of a mounting part, to thereby improve the positioning precision of a stage.

The present invention in another aspect thereof improves the exposure precision when such a stage is incorporated into an exposure apparatus.

Specifically, in accordance with one aspect, the present invention provides a stage device, comprising a base, a stage movable portion being movable along the base without contact thereto, an interferometer configured to measure a position of the stage movable portion, at least one of a piping element and a wiring element connected to the stage movable portion, and at least one of a heat insulating material and a heat collecting unit configured to reduce heat to be transferred from the piping element or wiring element to a space through which measurement light of the interferometer passes.

It should be noted here that, in this specification, the words "piping element" (pipe or tube) and "wiring element" (wire or cable) are used interchangeably; in some cases, "piping element" includes "wiring element" and vice versa.

These and other objects, features and advantages of the present invention will become more apparent upon a consideration of the following description of the preferred embodiments of the present invention, taken in conjunction with the accompanying drawings.

DESCRIPTION OF THE PREFERRED EMBODIMENTS

Preferred embodiments of the present invention will now be described with reference to the attached drawings.

First Embodiment

Referring first to FIGS. 1, 2, 3A and 3B, a first embodiment of the present invention will be described.

Figure 1:
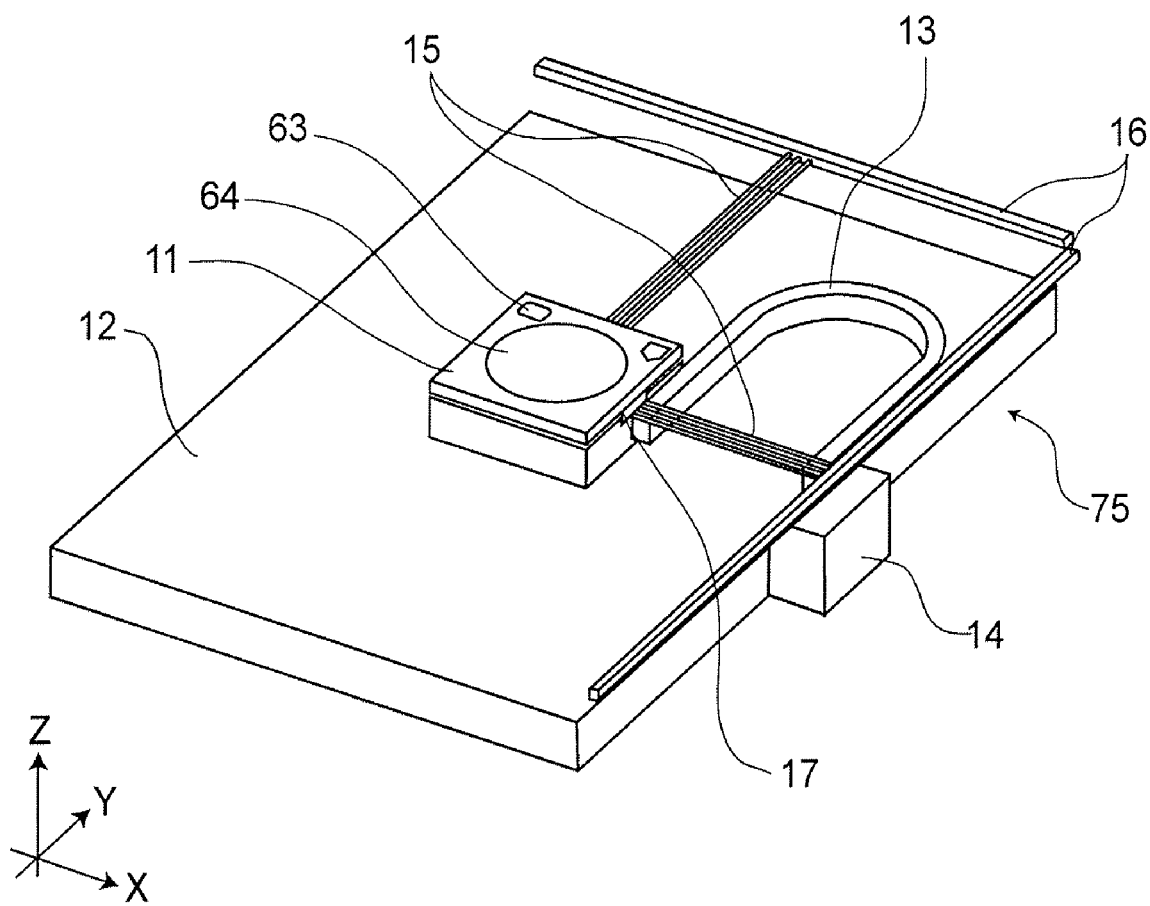
FIG. 1 is a perspective view of a general structure of a stage device.
Figure 2:
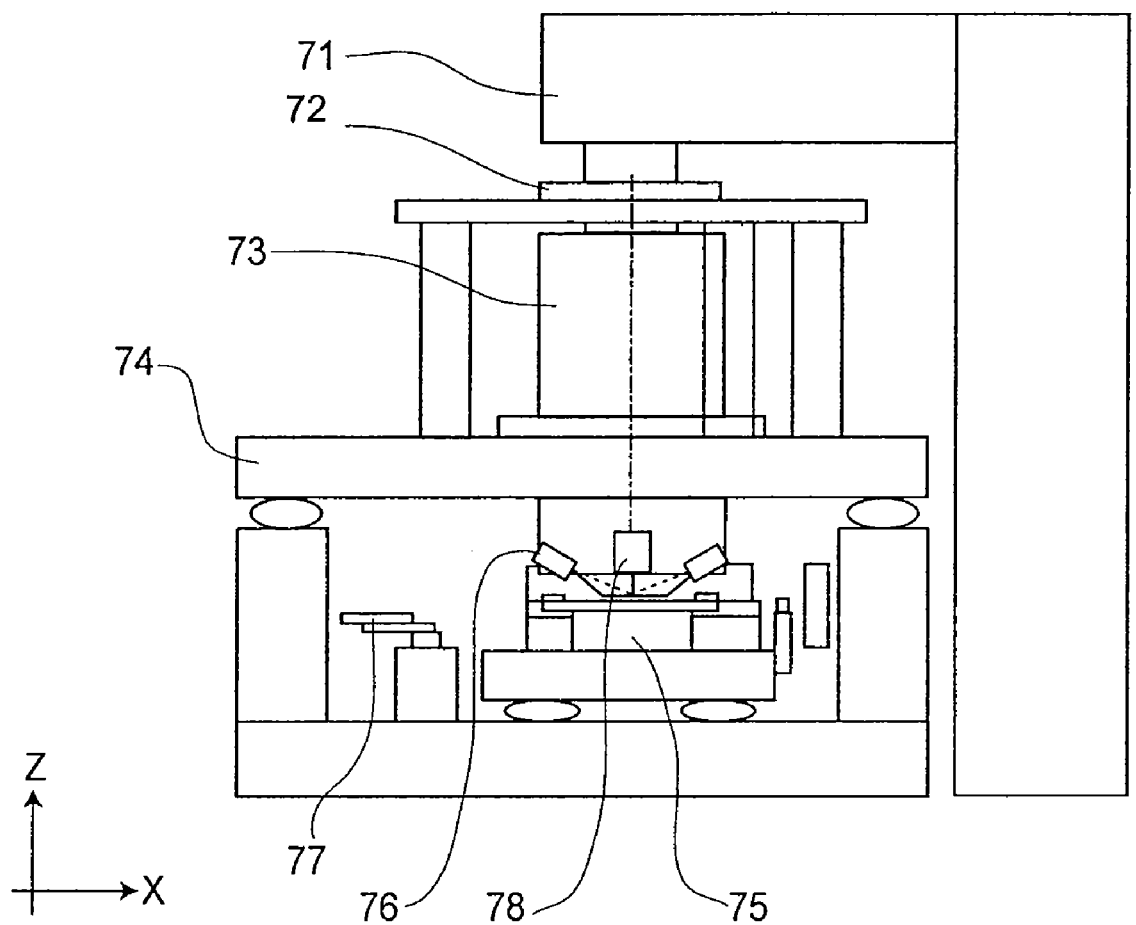
FIG. 2 is a schematic view of a general structure of an exposure apparatus into which a stage device is incorporated.

FIG. 1 is a perspective view of a stage device which is arranged to move a wafer successively and sequentially, in response to successive exposures of the same. FIG. 2 shows a general structure of an exposure apparatus in which the stage device of FIG. 1 is used to move the wafer successively and sequentially, in response to successive exposures of the same.

As shown in FIG. 1, the stage device generally denoted at 75 includes a stage movable portion 11, which is movable in two-dimensional directions along a stage base 12 surface without contact thereto. There is an illuminance sensor 63 mounted on the top surface of the stage movable portion 11. The sensor 63 measures the illuminance of exposure light prior to the exposure, for calibration thereof, and the result of the measurement is used to correct the exposure amount. There is a wafer conveyance robot 77 for supplying a wafer 64 onto the stage device 75. A reticle, which is an original that carries an exposure pattern to be transferred, is placed on a reticle stage 72. The reticle stage 72 scanningly moves the reticle relative to a wafer 64 at a predetermined reduction exposure magnification ratio. There is a reduction projection lens 73 for projecting an image of the original pattern onto the wafer 64 in a reduced scale. The wafer 64 is made of monocrystal silicon, and the surface thereof is coated with a resist material, which causes a chemical reaction in response to irradiation with exposure light. In this embodiment, the subject of exposure is wafers. However, exposure may be made to liquid-crystal substrates or other things.

The main frame 74 of the exposure apparatus supports the reticle stage 72, reduction projection lens 73 and stage device 75. A focusing scope 76 is provided to perform focusing measurement to the wafer 64. An alignment scope 78 is a measurement microscope having a function for measuring an alignment mark (not shown) formed on the wafer 64 and a reference mark (not shown) provided on the stage, to perform wafer 64 alignment and reticle-to-wafer alignment as well.

There are mounting parts 22, such as wiring elements or piping elements, connected to the stage movable portion 11. These mounting parts are connected to a driving power and signal voltage source 14, which is fixed to the stage base. As an alternative, the voltage source 14 may be connected to any member other than the stage base 12, and the mounting parts 22 may be connected to any stationary member other than the voltage source 14. The mounting parts 22 are flexibly supported by an auxiliary member 13.

Typical examples of these mounting parts 22 are wiring elements, such as driving power cables and control cables, signal cables for transmitting outputs of various sensors, and piping elements, such as coolant tubes for temperature control of the driving unit, and tubes for supplying compressed air to various bearing units.

The position of the stage movable portion 11 with respect to the X and Y directions is measured by use of laser interferometers 17 mounted at the stage movable portion 11, as well as interferometer mirrors 16 mounted at the stage base 12. As an alternative, the interferometer mirror 16 may be mounted at the stage movable portion 11, while the interferometer 17 may be disposed at the position corresponding to the interferometer mirror 16 of FIG. 1. Anyway, there are interferometer light paths 15, each being defined along a straight line connecting one interferometer 17 and an associated one interferometer mirror 16, and these are used as the path of measurement light. Hence, it is seen that each interferometer light path 15 is quite close to the stage movable portion 11 or auxiliary member 13.

If the temperature of the air around the measurement light path 15 changes due to a temperature change of the mounting parts 22, it would cause an error in the length measured by the interferometer. However, by specifically arranging the structure of the auxiliary member 13 for supporting the mounting parts 22 in accordance with this embodiment of the present invention, heat outflow toward the interferometer light path can be well suppressed, and the measurement error can be reduced significantly.

Figure 3B:
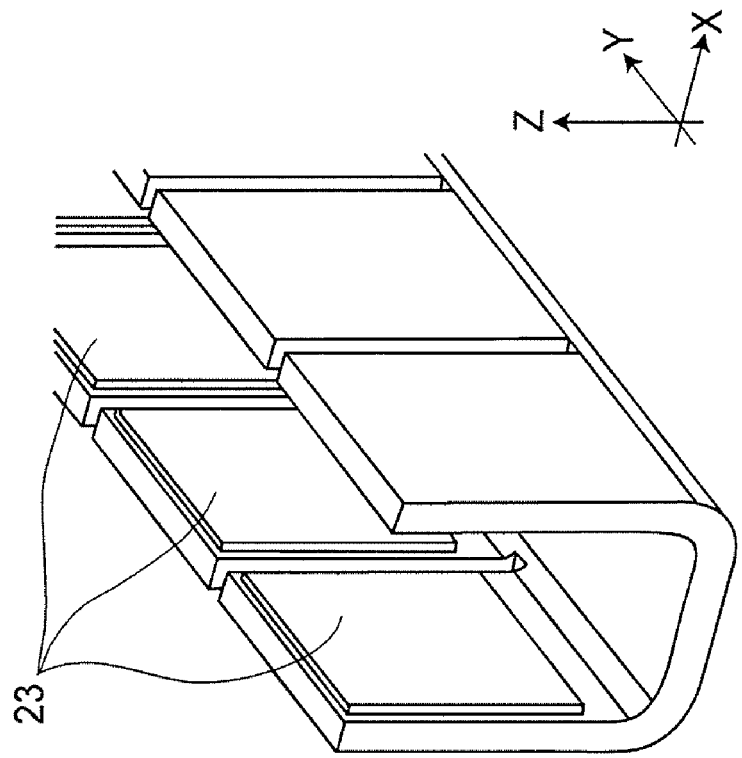
FIG. 3B is a fragmentary and perspective view for explaining the relationship between the auxiliary member and the heat insulating material used in the stage device of FIG. 3A.
Figure 3A:
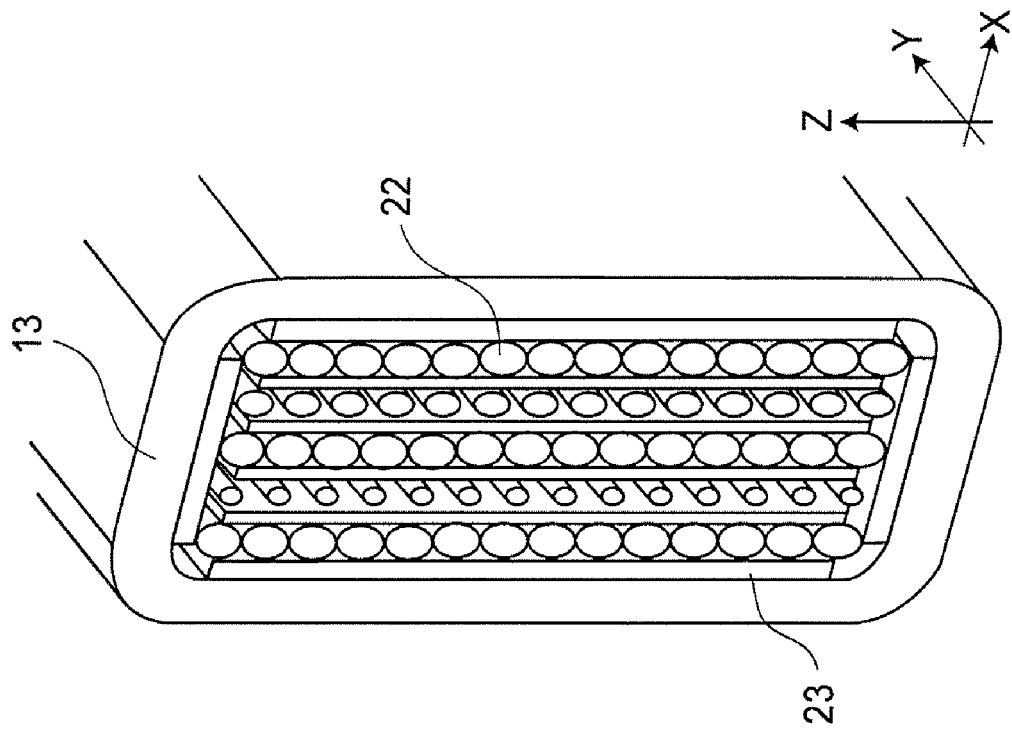
FIG. 3A is a fragmentary and perspective view for explaining the structure of an auxiliary member, wiring or piping elements, and a heat insulating material used in a stage device according to a first embodiment of the present invention.

FIG. 3A is a perspective view showing the sectional structure of the auxiliary member 13 that functions to bundle the mounting parts 22 to flexibly connect the stage movable portion 11 and the stage stationary portion to each other. The auxiliary member 13 may be a component known as a "Cableveyor" (trademark), for example, which is flexibly deformable to some extent, while supporting wiring elements or piping elements. In other words, the auxiliary member 13 functions as a supporting guide member for supporting and guiding piping elements or wiring elements. The auxiliary member 13 may partially encircle the piping elements or wiring elements 22 or, alternatively, it may completely surround the elements 22.

The mounting parts 22 may produce a temperature change due to the following factors. First, as far as the driving power cables are concerned, the wire itself generates heat due to the electrical resistance thereof, in response to supply of electrical current to the driving unit, and this causes a temperature rise. As far as the coolant having temperature-controlled the driving unit is concerned, the temperature thereof has increased in response to collection of heat from the driving unit. Naturally, this results in a temperature rise of the coolant tubes through which the coolant flows. In some cases, from the standpoint of cooling efficiency of the driving unit, a coolant having a temperature lower than the reference temperature set with respect to the stage (it may be the ambient temperature of the stage) is used. On that occasion, the temperature of the coolant tube decreases, following it.

In consideration of these factors, in this embodiment, there is a heat insulating material 23 provided between the mounting parts 22 and the inner surface of the auxiliary member 13. The heat insulating material 23 serves to avoid or to reduce the transfer of heat, caused by the temperature change of the mounting parts 22, to the auxiliary member 13. Namely, this heat insulating material 23 is effective to avoid or to reduce leakage of heat from the mounting parts 22 to the external ambience, which includes the interferometer light path 15, that is, to the ambience on the stage base 12.

As shown in FIG. 3A, in one embodied form, the heat insulating material 23 may be fixed to the inner surfaces of the left- and right-hand walls of the auxiliary member 13, as well as inner surfaces of the top and bottom walls of the auxiliary member 13. It is sufficient that the heat insulating material is so disposed at the auxiliary member 13 so as to reduce the heat transfer from the wiring elements or piping elements to the space through which the measurement light of the interferometer passes. As an alternative, the heat insulating material may be provided at the interspace between the wiring elements or piping elements, with a result of a further decrease of heat transfer to the space around the measurement light. The heat insulating material 23 may preferably be made of a material having a heat conductivity not greater than 0.1 W/m·°C. Alternatively, the heat insulating material 23 can be made of a material having a heat conductivity not greater than half of that of the auxiliary member 13. In order to keep the flexibility, the heat insulating material 23 may preferably have a thickness not greater than 0.5 mm. In this embodiment, since the heat insulating material is not directly adhered to the wiring elements or piping elements, the flexibility of the wiring elements or piping elements is not degraded by much. This means that the influence of any disturbance force to be applied to the stage when the wiring elements or piping elements are bent can be avoided or reduced.

FIG. 3B is a perspective view for explaining the relationship between the auxiliary member 13 and the heat insulating material 23. The heat insulating material 23 may be divided into plural segments, for example, each being fixed to the inner wall of the auxiliary member 13. This structure has a further advantage of facilitating the effect of reducing a decrease in flexibility described above.

The auxiliary member 13 is formed with vertical slits at regular-interval positions, for enhanced deformability in shape. The heat insulating material 23 (segment) is fixed to the wall surface region between adjacent slits, by adhesion, using an adhesive agent or any other fixing method.

When the auxiliary member 13 consists of plural structures, each structure may be provided with a heat insulating material 23 to reduce the heat transfer. The heat insulating material 23 may preferably be made of a low friction material, for it improves the slidability of wiring elements, slidability between the wiring elements and the auxiliary member 13, or mutual slidability between wiring elements or piping elements. An example of the material having a desirable heat insulating characteristic and slidability described above is Gore-Tex®.

In accordance with this embodiment of the present invention, a heat insulating material is provided to reduce heat transfer from the mounting parts (wiring elements or piping elements) 22 to the space through which the measurement light from the interferometer passes. Hence, a measurement error due to the temperature change of the mounting parts 22 can be avoided or well reduced.

Furthermore, since, in this embodiment, the heat insulating material is mounted at the auxiliary member 13, the flexibility of the mounting parts 22 is maintained, and any force to be applied from the mounting parts to the stage movable portion 11 is well suppressed. As a result, the positioning precision of the stage movable portion 11 is improved significantly.

Second Embodiment

Next, a second embodiment of the present invention will be described. The basic structure of this embodiment is similar to that of the first embodiment shown in FIGS. 1 and 2, but the structure around the auxiliary member 13 is a bit different from the first embodiment.

Figure 4A:
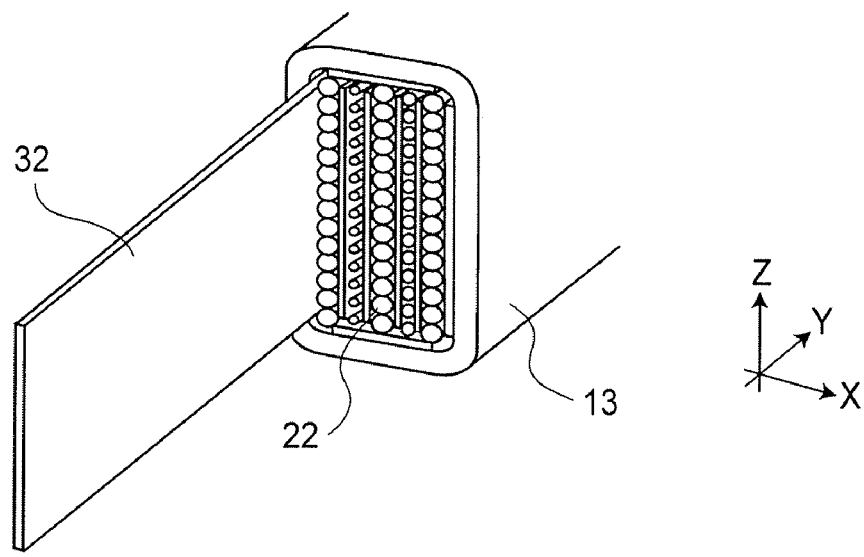
FIG. 4A is a fragmentary and perspective view for explaining the structure of an auxiliary member, wiring or piping elements, and a high heat-conductivity material used in a stage device according to a second embodiment of the present invention.
Figure 4B:
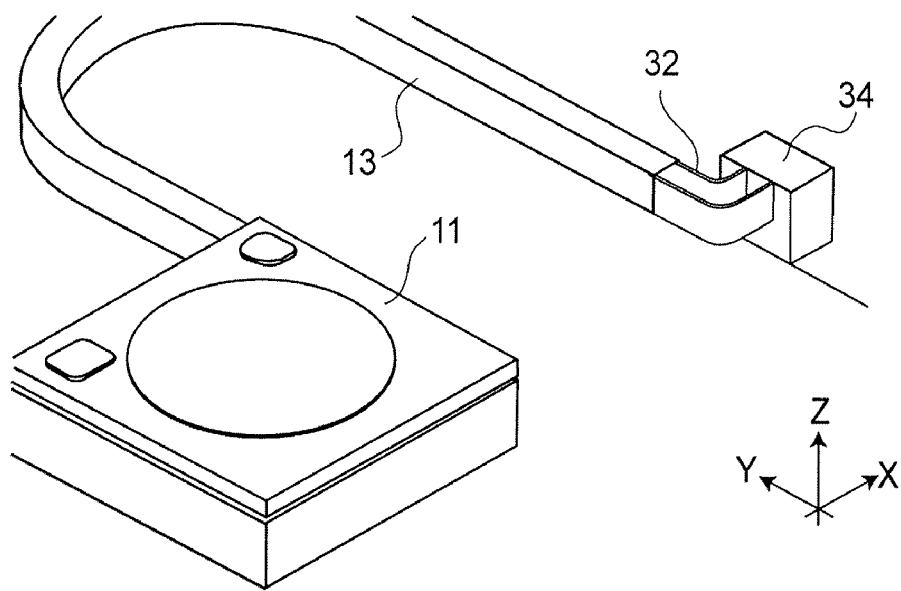
FIG. 4B is a fragmentary and perspective view for explaining the relationship among the auxiliary member, the high heat-conductivity material and a stage movable portion of the stage device according to the second embodiment of the present invention.

FIGS. 4A and 4B are perspective views, showing the structures around the auxiliary member 13 of the stage device 75. Specifically, FIG. 4A illustrates a sectional plane of the structure, including auxiliary member 13 and inside mounting parts 22. In this embodiment, as in the first embodiment, the mounting parts 22 are supported by the auxiliary member 13. Mounted between the auxiliary members 13 and the mounting parts 22, at the left- and right-hand sides, as viewed in the drawing, are high heat-conductivity materials 32 of a planar shape, having good flexibility.

For example, such high heat-conductivity material 32 may be made of a high-orientation carbonaceous fiber film having a high coefficient of heat conductivity not less than 10 W/(m·K) with respect to the surface direction thereof, but having a low coefficient of heat conductivity with respect to the thickness direction thereof.

FIG. 4B illustrates the relationship between the auxiliary member 13 and a cooling system 34. The heat produced at the mounting parts 22 is removed by this cooling system 34 through the high heat-conductivity material 32. The cooling system may include a circulation mechanism for circulating a coolant, for example. The cooling system is not provided on the movable stage 11, but rather, in order to avoid interference with the motion, it may preferably be disposed adjacent to the driving power and signal voltage source 14 (see FIG. 1).

By using the high heat-conductivity material 32 to transfer the heat to the cooling system 34, leakage of the heat to the external ambience, which includes the interferometer light path 15, that is, to the ambience on the stage base 12, is prevented. More specifically, the heat transferred, from the stage movable portion 11 to the driving power and signal voltage source 14 through the high heat-conductivity material 32, is removed (absorbed) by the cooling system 34.

As regards the provision of the high heat-conductivity material 32 and the cooling system 34, it is sufficient that these components are so disposed in relation to the auxiliary member 13 so as to reduce the heat transfer from the mounting parts 22 to the space where the measurement light path 15 is defined. In this embodiment, since the high heat-conductivity material 32 is not directly adhered to the mounting parts, the flexibility of the mounting parts is not much degraded. This means that the influence of any disturbance force to be applied to the stage movable portion 11, when the mounting parts are bent, can be avoided or reduced.

The high heat-conductivity material is a low friction material, and this enhances the slidability of the auxiliary member 13 and the wiring or piping elements 22. Therefore, it has little influence on the deformability (maneuverability) of the mounting parts 22 and the auxiliary member 13. Although, in FIG. 4B, a portion of the high heat-conductivity materials 32 adjacent to the cooling system 34 is exposed, this is for convenience of illustration and, as a matter of course, this portion may be completely surrounded by the auxiliary member 13.

In accordance with this embodiment of the present invention, a heat collecting unit is provided to reduce heat transfer from the mounting parts (wiring elements or piping elements) 22 to the space through which the measurement light from the interferometer passes. Hence, a measurement error due to the temperature change of the mounting parts 22 can be avoided or reduced. The heat collecting unit may include the high heat-conductivity material 32 provided at the auxiliary member 13 and the cooling system 34 for cooling the high heat-conductivity material 34, as described above.

Furthermore, since, in this embodiment, the high heat-conductivity material 32, which is one component of the heat collecting unit, is mounted at the auxiliary member 13, the flexibility of the mounting parts 22 is maintained, and any force to be applied from the mounting parts to the stage movable portion 11 is well reduced. As a result, the positioning precision of the stage movable portion 11 is improved significantly.

Third Embodiment

Next, a third embodiment of the present invention will be described, with reference to FIGS. 5A and 5B. The basic structure of this embodiment is similar to that of the first embodiment shown in FIGS. 1 and 2, but the structure around the auxiliary member 13 is different from that of the first embodiment and the second embodiment.

Figure 5A:
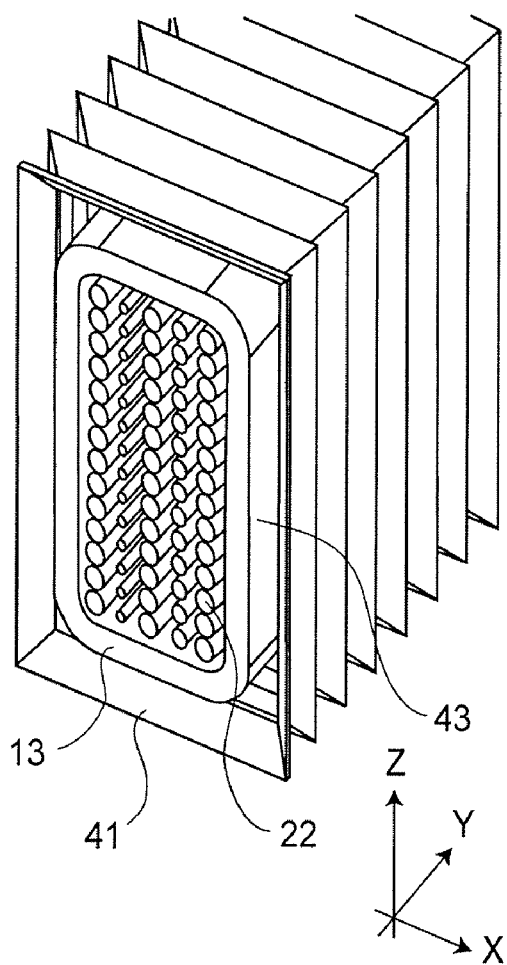
FIG. 5A is a fragmentary and perspective view for explaining the structure of an auxiliary member, wiring or piping elements and a surrounding member for covering the outside periphery of the auxiliary member, in a stage device according to a third embodiment of the present invention.
Figure 5B:
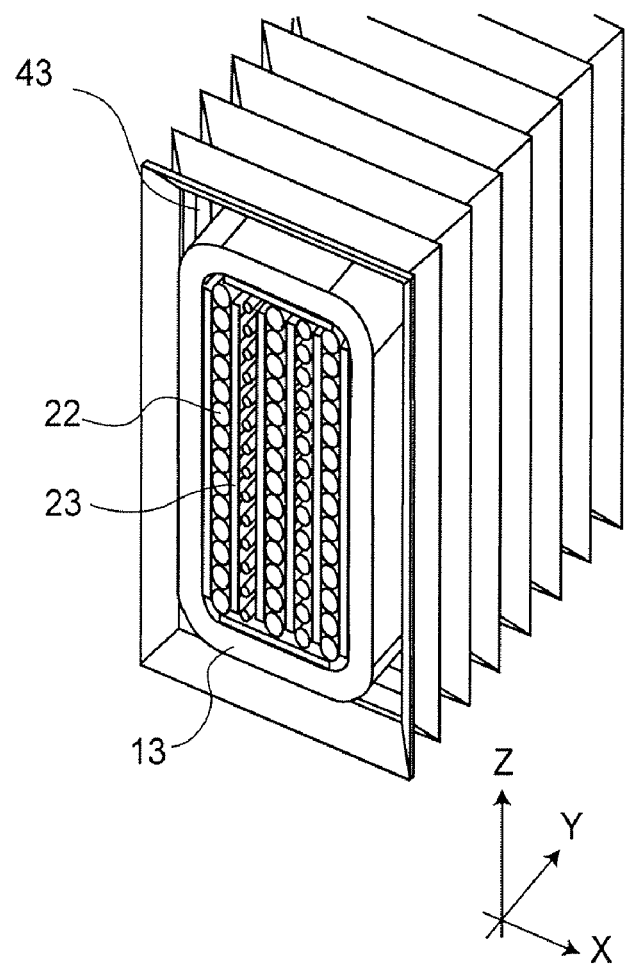
FIG. 5B is a fragmentary and perspective view for explaining the relationship among the auxiliary member, the wiring or piping elements, a heat insulating material (high heat-conductivity material) and the surrounding member covering the outside periphery of the auxiliary member, in the stage device according to the third embodiment of the present invention.

FIGS. 5A and 5B are perspective views of the structure around the auxiliary member of the stage device 75. Specifically, FIG. 5A illustrates a sectional plane of the structure, including auxiliary member 13 and inside mounting parts 22. As shown in the drawing, the auxiliary member 13 supports the mounting parts 22, and the outer periphery of this auxiliary member 13 is covered by a surrounding member 41 with a predetermined interspacing maintained therebetween. The surrounding member 41 may have a bellows structure, for example, having good flexibility and a good heat insulating property.

An interspace is defined between the auxiliary member 13 and the surrounding member 41 that covers the outer periphery of it, and this provides a heat exhausting space 43. With this arrangement, the heat resulting from the temperature change of the mounting parts 22 is exhausted together with the gas whose temperature has been changed, such that any leakage of heat to the space around the stage movable portion 11, including the interferometer light path 15 (see FIG. 2), is prevented. Here, the thermal exhausting space 43 is provided to exhaust the heat from the mounting parts 22 through the surrounding member 41, without leakage toward the stage movable portion 11. Hence, it is sufficient that a space is defined between the mounting parts 22 and the surrounding member 41 covering them, through which a gas, such as air, can flow. Therefore, if the mounting parts 22 can be laid on by self-support, the auxiliary member 13 for supporting them may be omitted. Hence, the provision of the auxiliary member 13 is not indispensable, in this sense. Furthermore, if there is a member that provides both the function of the auxiliary member 13 (i.e., flexibly supporting the mounting parts 22) and the function of the surrounding member 41 (i.e., covering the mounting parts 22), such a member may be provided around the mounting parts 22.

The heat exhausting space 43 can be exhausted (evacuated) by using a suction mechanism (not shown), such as a suction blower or a vacuum pump, for example, disposed at the stage stationary portion and by appropriately connecting it to an end of the surrounding member 41. The exhaust gas is then discharged outwardly, so that it does not adversely affect the space around the stage movable portion 11.

FIG. 5B illustrates a sectional plane of a structure of this embodiment, as combined with the second embodiment, in regard to the auxiliary member 13 and the inside mounting parts 22. In this embodiment, along the vertical arrays of the mounting parts 22, heat insulating materials 23 or high heat-conductivity materials 32 are provided (in the illustrated example, heat insulating materials 23 are provided). This arrangement efficiently reduces heat transfer to the interferometer measurement space.

When a high heat-conductivity material 32 is used along the mounting parts 22 inside the auxiliary member 13, a cooling system 34 may preferably be used, as in the second embodiment, to enhance the heat exhausting effect.

The structure using a heat insulating material 23 or a high heat-conductivity material 32 along the vertical array of the mounting parts 22, in this example, may, of course, be applied to the first and second embodiments described above.

In accordance with this embodiment of the present invention, a heat collecting unit is provided to reduce heat transfer from the mounting parts 22 to the space through which the measurement light from the interferometer passes. Hence, a measurement error due to the temperature change of the mounting parts 22 can be avoided or reduced. The heat collecting unit may include, in this embodiment, the surrounding member 41, which covers the auxiliary member 13 and exhausting means, for exhausting the inside space of this surrounding member 41.

With this arrangement, heat produced at the mounting parts 22 can be collected while maintaining the flexibility of the mounting parts 22 with the use of the auxiliary member 13.

The surrounding member 41 and exhausting means for exhausting the inside spaces of the surrounding member described above may be added to the structure according to the first and second embodiments.

Fourth Embodiment

Next, a fourth embodiment of the present invention will be described with reference to FIG. 6. The basic structure of this embodiment is similar to the first embodiment shown in FIGS. 1 and 2. This embodiment is an example wherein the structure around the auxiliary member 13 in the first embodiment is further modified.

Generally, the mounting parts extending around the movable stage 11 are categorized as follows. There are driving cables 22a having a potentiality that the wire itself generates heat, and coolant returning tubes 22c having a potentiality of a temperature rise. On the other hand, there are sensor output transmitting cables 22a, whose temperature change can be disregarded, and coolant supplying tubes 22b, through which a temperature controlled coolant flows, so that the temperature change thereof can be disregarded. In consideration of this, in this embodiment, the disposition of the mounting parts 22 is specifically arranged, while taking into account the features of the mounting parts as described above, so as to minimize the influence to the ambience of the interferometer light path 15.

Figure 6:
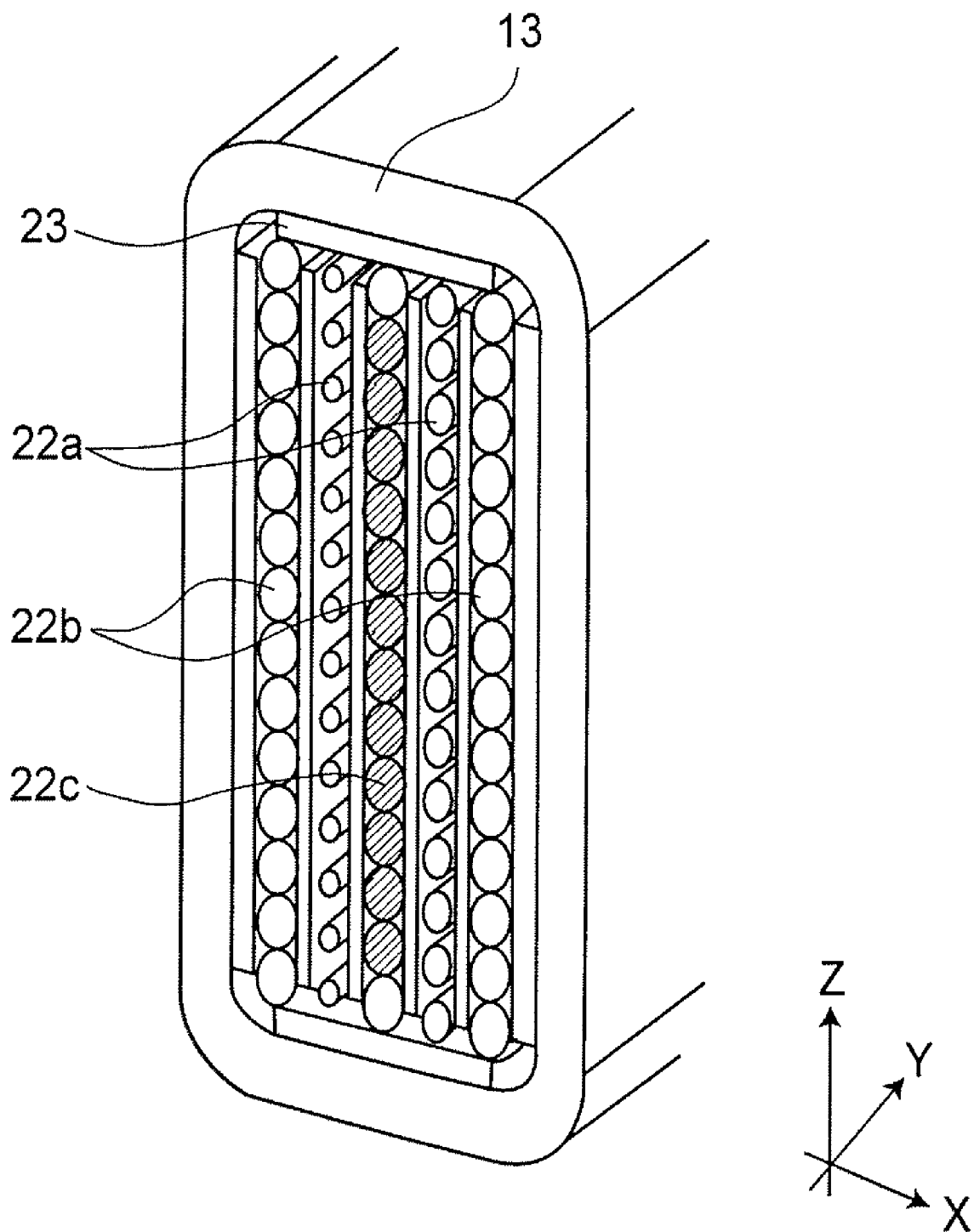
FIG. 6 is a fragmentary and perspective view for explaining the positional relationship between wiring or piping elements disposed inside an auxiliary member of a stage device, according to a fourth embodiment of the present invention.

As shown in FIG. 6, those mounting parts from which heat generation or temperature change easily occurs (for example, cables 22a or coolant returning tubes 22c) are placed at a central portion of the mounting part bundle 22, as much as possible, rather than being disposed at an outer peripheral portion of the bundle. Those tubes, shown by hatching in FIG. 6, are coolant returning tubes 22c, through which the coolant having collected heat generated at the driving unit, or the like, returns. Since a temperature rise is expected there, these tubes are placed at the central portion of the bundle of mounting parts. On the other hand, the coolant supplying tubes 22b, through which a temperature controlled coolant flows, have a stabilized temperature and, therefore, these are disposed at an outer peripheral portion of the mounting part bundle. If the coolant returning tubes 22c have little temperature change and the influence thereof is small, they may be disposed at the outer peripheral portion. Anyway, in accordance with this embodiment, the piping elements, having a stabilized temperature, are disposed at an outer peripheral portion (periphery) of the mounting part bundle. Although, in this embodiment, the coolant supplying tubes 22b, having a stabilized temperature, are disposed at the outer periphery of the mounting part bundle, to thereby stabilize the peripheral temperature of the bundle, specialized temperature adjusting tubes having a controlled temperature may be provided at the peripheral portion of the mounting part bundle.

On the other hand, those mounting parts, such as follows, are intentionally disposed at the central portion of the mounting part bundle. Namely, these mounting parts include driving cables 22a possibly generating a temperature rise due to heat generation of the wire itself by the electrical current, and coolant returning tubes 22c possibly generating a temperature rise due to the flow of coolant having collected heat produced at the driving unit.

As far as the influence to the space around the interferometer light path 15 is concerned, a good result will be obtainable only by disposing temperature-stabilized coolant tubes, at least at the surface opposed to the interferometer light path 15. In the mounting part bundle shown in FIG. 6, the interferometer light path 15 is defined in the +Z direction of the mounting part bundle (auxiliary member 13) as seen in FIG. 1. Namely, in FIG. 6, the temperature change, which occurs at the top surface (+Z surface) of the mounting part bundle has the largest influence upon the interferometer light path 15. In consideration of this, placing temperature-stabilized coolant tubes (coolant supplying tubes 22b or specialized temperature controlling tubes) may preferably be provided at least at the outer peripheral portion adjacent to the top surface of the bundled mounting parts. If it is allowed by design, temperature-stabilized coolant tubes may more desirably be provided at the outer peripheral portion along the side faces (+X surface and −X surface) and, additionally, at the bottom surface (−Z surface).

It should be noted that this embodiment is applicable to the mounting parts 22 of the first to third embodiments. Namely, a heat insulating material or a heat collecting unit may be provided so as to reduce heat transfer from the mounting parts 22 to the space through which the measurement light of the interferometer passes, while, with regard to the mounting parts 22, piping elements through which temperature controlled coolant flows are disposed at the outer periphery thereof. With this arrangement, heat transfer, from the mounting parts 22 to the space where the measurement light from the interferometer passes, can be reduced significantly.

Fifth Embodiment

The first to fourth embodiments have been explained with reference to examples wherein the influence of a temperature change, of those mounting parts, among the mounting parts connected to the stage movable portion 11, that extend out of the stage movable portion 11, is reduced. In this embodiment, as compared therewith, a description will be made of an example wherein the influence of a temperature change of those mounting parts, which are disposed at the stage movable portion 11, upon the measurement light path 15, is reduced. The basic structure of this embodiment is similar to the first embodiment shown in FIGS. 1 and 2. This embodiment is an example wherein the structure around the stage movable portion 11 is further modified.

First of all, in order to identify the problems to be solved here, the influences of the temperature change of the mounting ports in a conventional structure will be explained with reference to FIGS. 7A and 7B.

Figure 7A:
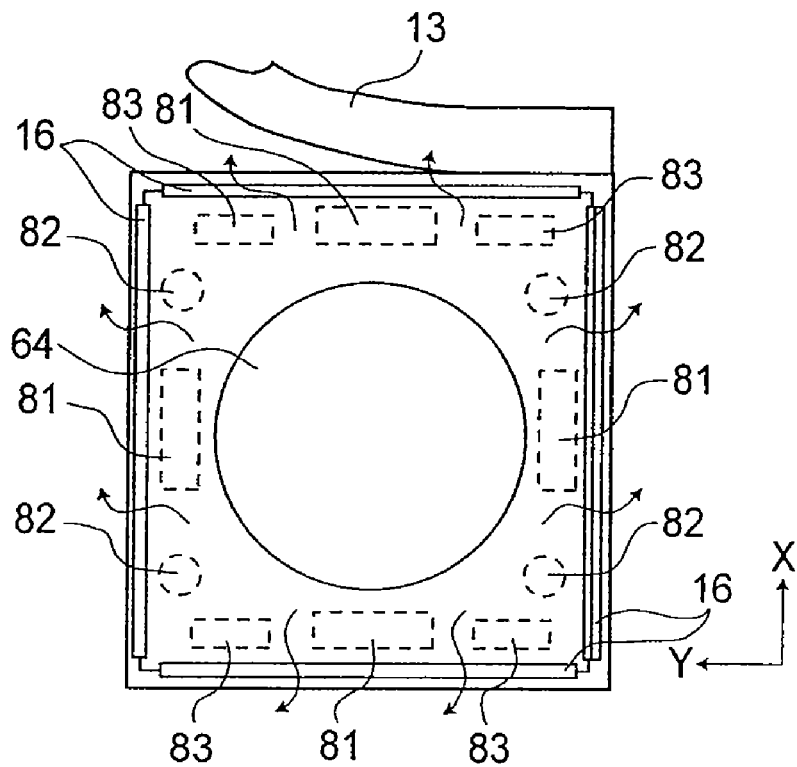
FIGS. 7A and 7B are a top plan view and a sectional view, respectively, for explaining the structure around a stage movable portion of a known-type stage device.
Figure 7B:
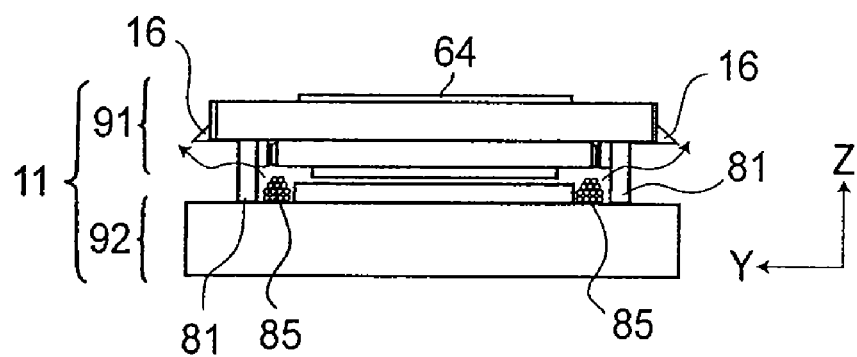

FIGS. 7A and 7B show a stage movable portion 11 of a conventional structure. The stage movable portion 11 has a rough-motion and a fine-motion structure, and it comprises a rough-motion stage (first stage) 92 and a fine-motion stage (second stage) 91 mounted on the rough-motion stage 92 and being movable through a smaller stroke as compared with the rough-motion stage 92. FIG. 7A is a top plan view of the stage movable portion 11, as seen from above. Those elements denoted by broken lines are part groups 81, 82 and 83 mainly for the fine-motion driving, which are provided between the rough-motion stage 92 and the fine-motion stage 91. FIG. 7B schematically shows a sectional plane of the movable stage 11, taken along a Y-axis direction around the wafer 64 center. An auxiliary member 13 is connected to this stage movable portion 11, and mounting parts 22, such as described hereinbefore, are disposed at this auxiliary member 13. If the wafer should be moved along the stage base 12 through a large stroke, the movement is provided by the rough-motion stage 92. For precise positioning of the wafer 64, the fine-motion stage 91 is used. Mounted on the rough-motion stage 92 is a weight compensating mechanism 83 for floating the fine-motion stage 91 without contact, and an electromagnetic joint mechanism 81 for applying an acceleration force and a deceleration force to the fine-motion stage 91, without contact thereto, during acceleration and deceleration of the rough-motion stage 92. Furthermore, there is a position sensor 82 for measuring the relative positional relationship between the rough-motion stage 92 and the fine-motion stage 91.

The mounting parts connected to the stage movable portion 11 extend through the stage movable portion 11, and stretch outwardly of the stage movable portion 11. The mounting parts 85 shown in the drawing are piping elements or wiring elements extending through the stage movable portion 11. Generally, these mounting parts 85 (not shown in FIG. 7A) extend through a narrow region sandwiched by the fine-motion stage 91 and the rough-motion stage 92, as shown in FIG. 7B, and surrounded by the driving unit and sensors (81, 82 and 83) and, in many cases, these parts are in a space where the air flow is quite slow. Arrows in FIG. 7A depict air flow in the interspace between the fine-motion stage 91 and the rough-motion stage 92. Because of the slow air flow, if the temperature of the mounting parts 85 increases, for example, the air around the mounting parts 85 is warmed up, and the thus temperature-raised air gradually flows outwardly around the stage movable portion 11, due to the influence of its buoyancy. As a result, the air temperature around the interferometer mirror 16 disposed at the stage movable portion 11, namely, the air temperature around the interferometer light path 15 changes, resulting in an interferometer measurement error. Furthermore, if the temperature-raised air stays between the fine-motion stage 91 and the rough-motion stage 92, heat will be transferred from the warmed-up air to the fine-motion stage 91, to cause thermal deformation of the same. Such thermal deformation will cause degraded stage positioning precision, resulting in exposure precision degradation.

From the investigations made by the inventors of the subject application, as described above, it has been found that, while the air temperature around the mounting parts 85 would change due to the temperature change of the mounting parts 85, the flow of such air into the interferometer light path 15 should be avoided or well suppressed. Furthermore, such temperature-changed air should not stay in between the fine-motion stage 91 and the rough-motion stage 92.

Figure 8A:
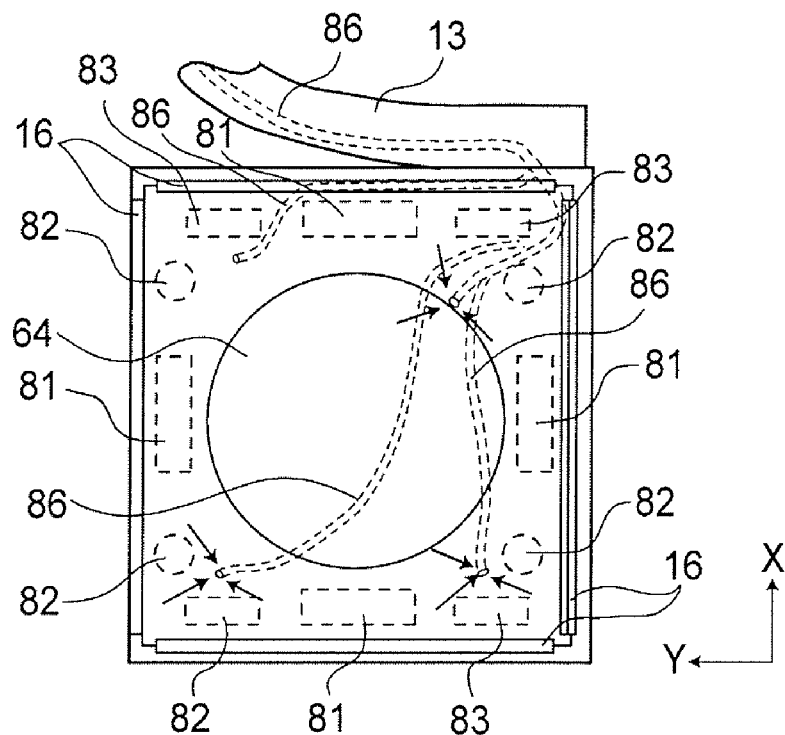
FIGS. 8A and 8B are a top plan view and a sectional view, respectively, for explaining an exhausting system around a stage movable portion of a stage device according to the fourth embodiment of the present invention.
Figure 8B:
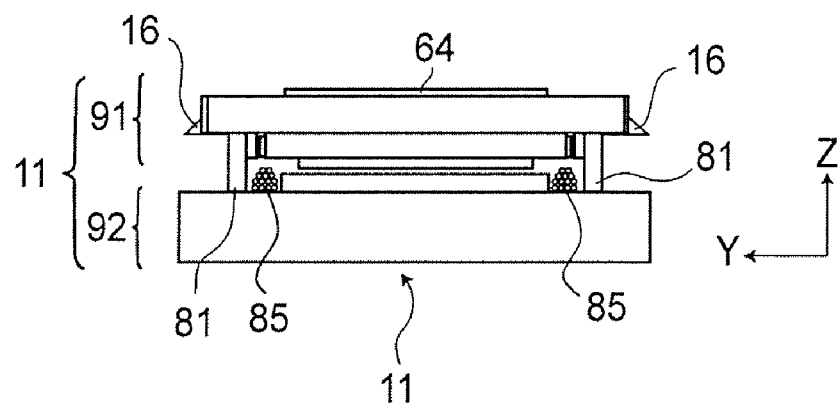

Based on these findings, in this embodiment of the present invention, the structure, such as shown in FIGS. 8A and 8B, is proposed. FIGS. 8A and 8B illustrate the stage movable portion 11, as in FIGS. 7A and 7B. In addition to the structure of FIGS. 7A and 7B, in this embodiment, there are vacuum suction ports (exhaust ports) for absorbing, by suction, air having its temperature changed by the temperature change of the mounting parts 85 (not shown in FIG. 8A), which are provided between the fine-motion stage 91 and the rough-motion stage 92. In this embodiment, vacuum suction tubes 86 are provided while taking into account the positions of the mounting parts 85, such that four vacuum suction ports are defined between the fine-motion stage 91 and the rough-motion stage 92. These vacuum suction tubes 86 are mounted together with the mounting parts supported by the auxiliary member 13, and these tubes are connected to exhausting means having a vacuum pump or a suction blower disposed outside the stage movable portion 11.

With this structure, the air having its temperature changed by the influence of the mounting parts is forcibly collected to the vacuum suction ports, and then, transferred to some place where the air does not adversely affect the positioning precision. Arrows in FIG. 8A depict air flow in the space between the fine-motion stage 91 and the rough-motion stage 92. As the air is absorbed (discharged) by the vacuum suction ports, fresh temperature-controlled air around the movable stage portion 11 flows into that area. Hence, definite air flows are created, as compared with the conventional structure, and the air conditioning performance in regard to the space between the fine-motion stage 91 and the rough-motion stage 92 is significantly improved thereby. Consequently, the temperature-changed air between the fine-motion stage 91 and the rough-motion stage 92 is assuredly prevented from leaking toward the interferometer light path 15 and, additionally, these flows are assuredly prevented from staying there for a long time.

Here, if there is a driving unit or a sensor in the space between the fine-motion stage 91 and the rough-motion stage 92, not only the mounting parts 85, but also, such a driving unit or a sensor will produce a temperature change. Therefore, the structure of this embodiment is quite effective in such a case.

In this embodiment, the mounting parts 22 extend through the inside space of the stage movable portion 11 and stretch outwardly of the stage movable portion 11, and a heat collecting unit is provided so as to reduce heat transfer from those mounting parts 22 disposed in this inside space, to the space through which the measurement light of the interferometer passes. The heat collecting unit may include exhausting means for exhausting the inside space of the stage movable portion 11, such that leakage of temperature-changed air inside this space to the space where the measurement light of the interferometer passes, and resulting heat transfer thereto, can be reduced. Here, the inside space of the movable stage portion 11 may preferably be a space encircled by the components that constitute the stage movable portion 11 and, as an example, it may be the space between the rough-motion stage and the fine-motion stage. If the stage has an integral structure producing both the rough motion and the fine motion, it may be a hollow inside space thereof.

Sixth Embodiment

Next, an embodiment, which corresponds to a modified example of the fifth embodiment, will be explained. The basic structure of this embodiment is similar to the first embodiment shown in FIGS. 1 and 2. The structure around the stage movable portion 11 is modified. The structural features of this embodiment, not particularly mentioned below, are the same as those in the fifth embodiment.

Figure 9A:
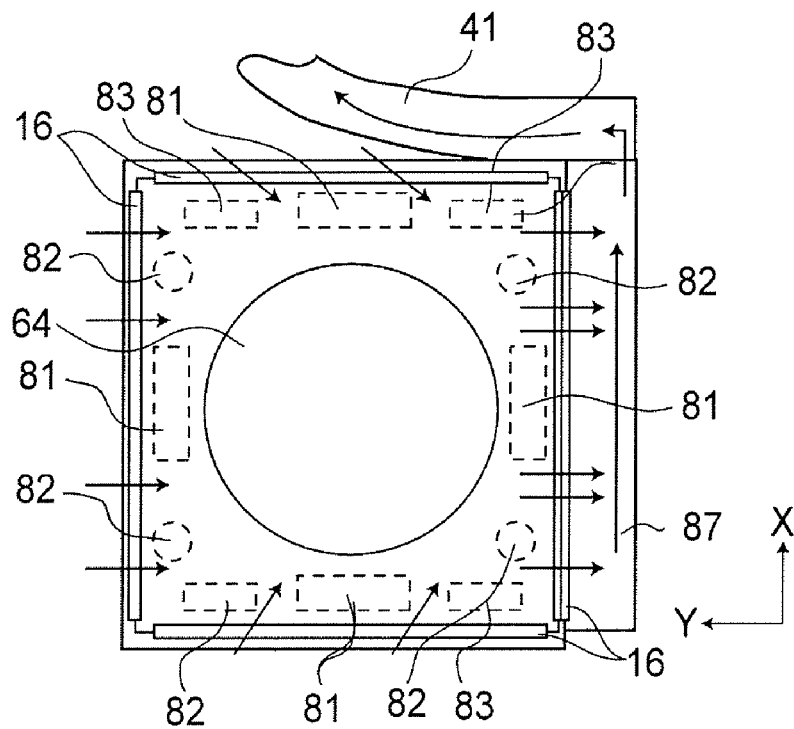
FIGS. 9A and 9B are a top plan view and a sectional view, respectively, for explaining an exhausting system around a stage movable portion of a stage device according to a fifth embodiment of the present invention.
Figure 9B:
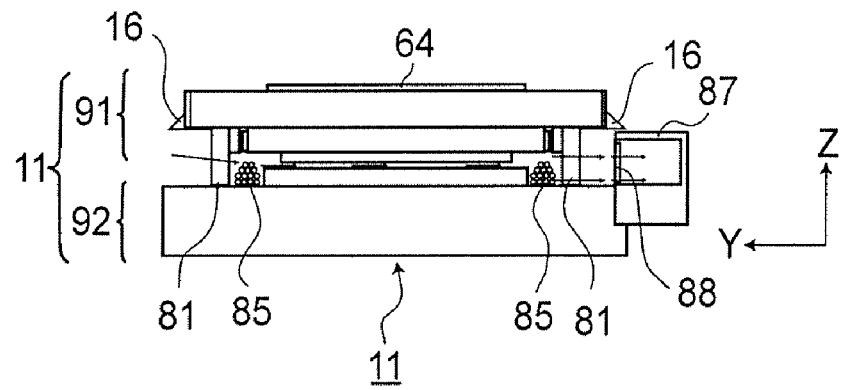

FIGS. 9A and 9B illustrate the structure according to this embodiment, wherein the exhaust port member 87 having an exhaust port is added at one side of the stage movable portion 11 shown in FIGS. 7A and 7B. The exhaust port member 87 is provided with a pressure adjusting member 88 to ensure that air in the interspace between the fine-motion stage 91 and the rough-motion stage 92 is uniformly and efficiently discharged. The pressure adjusting member 88 functions to adjust the pressure inside the exhaust port member to ensure uniform air discharging over the entire exhaust port. With this function, uneven distribution of discharging flow rate inside the exhaust port is well reduced. For example, the pressure adjusting member may be a pressure-loss adjusting filter or a plate-like member having plural holes distributed over the entire exhaust port. The exhaust port member 87 is fixed to the rough-motion stage 92 to avoid adverse influence on the wafer fine-motion positioning function.

The exhaust port member 87 is connected to a heat exhausting space 43, which is defined by the interspace between the auxiliary member 13 and the surrounding member 41, as has been described with reference to the third embodiment. Thus, it functions to transfer the discharged air to some place where the air does not adversely affect the positioning precision. In the fifth embodiment described above, temperature-changed air is locally discharged out of the movable stage portion 11. In this embodiment, on the other hand, the space between the fine-motion stage 91 and the rough-motion stage 92 is entirely exhausted. Arrows in FIG. 9A depict air flow in the space between the fine-motion stage 91 and the rough-motion stage 92. With the structure according to this embodiment, air flows quite uniformly, and the exhausting efficiency of the space between the fine-motion stage 91 and the rough-motion stage 92 is higher.

The exhaust port member 87 may be connected to vacuum suction tubes 86 mounted at the auxiliary member 13 to discharge air out of the stage movable portion 11, as has been explained with reference to the fifth embodiment.

In this embodiment, the piping elements or wiring elements 22 extend through the inside space of the stage movable portion 11, and stretch outwardly of the stage movable portion 11, and a heat collecting unit is provided so as to reduce heat transfer from those piping elements or wiring elements 22 disposed in this inside space, to the space through which the measurement light of the interferometer passes. The heat collecting unit may include exhausting means for exhausting the inside space of the stage movable portion 11, such that leakage of temperature-changed air inside this space to the space where the measurement light of the interferometer passes and resulting heat transfer thereto can be reduced. Here, the inside space of the movable stage portion 11 may preferably be a space encircled by the components that constitute the stage movable portion 11 and, as an example, it may be the space between the rough-motion stage and the fine-motion stage. If the stage has an integral structure producing both the rough motion and the fine motion, it may be a hollow inside space thereof.

Although the first to sixth embodiments have been described with reference to examples of a stage device applied to an exposure apparatus, the applicability of the stage device is not limited to the exposure apparatus. Furthermore, the stage device may be any one other than the plane-motor type, having a guide.

In an exposure apparatus according to any one of the embodiments described above, measurement errors due to a temperature change around a measurement light path of an interferometer can be reduced, and the positioning precision of the stage movable portion can be improved thereby. As a result, the exposure precision improves significantly.

Seventh Embodiment

Embodiment of a Microdevice Manufacturing Method

Next, referring to FIGS. 10 and 11, an embodiment of a device manufacturing method, which uses an exposure apparatus described above, will be explained.

Figure 10:
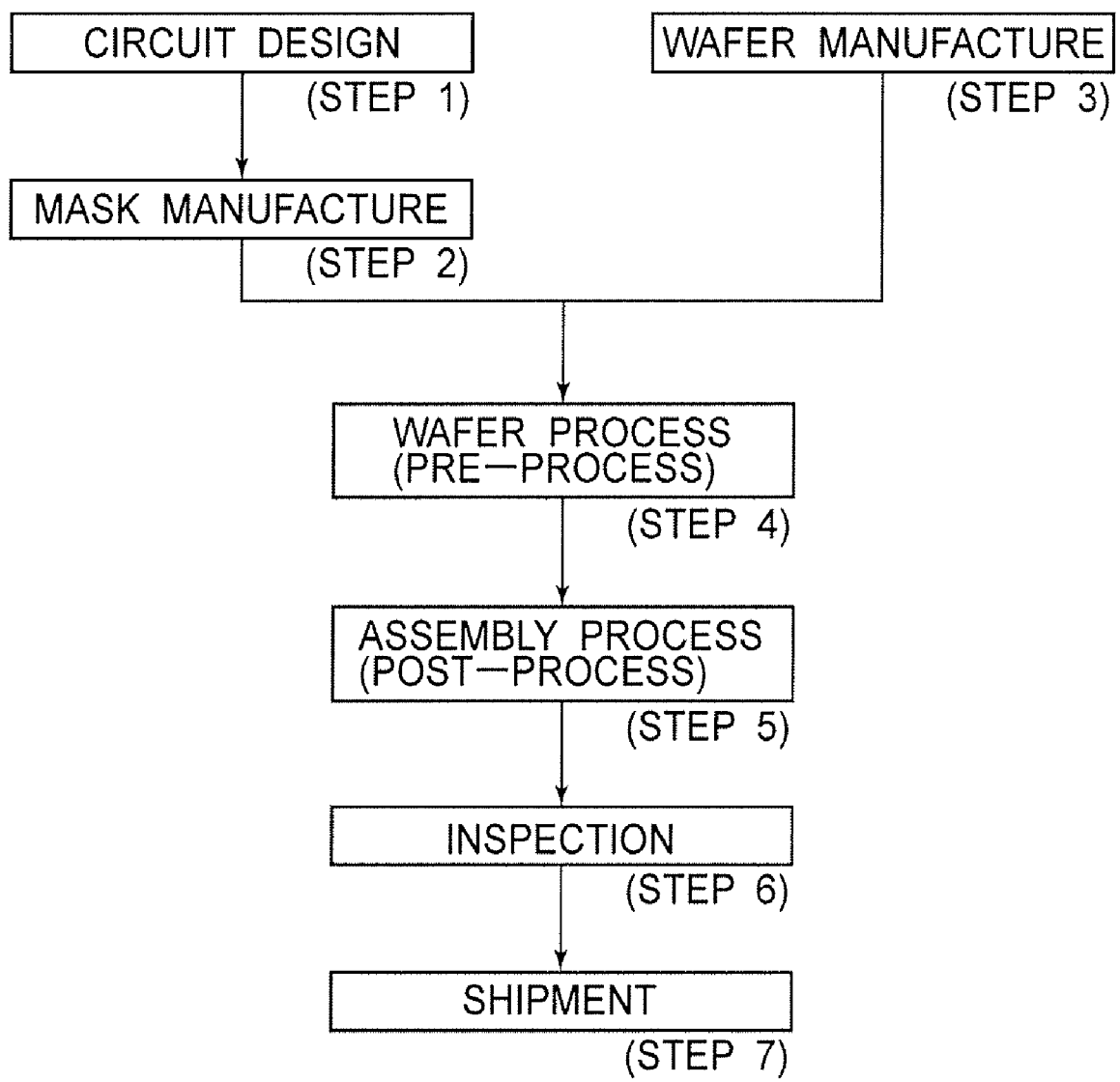
FIG. 10 is a flow chart for explaining microdevice manufacturing processes using a stage device according to any one of the preceding embodiments, and an exposure apparatus having the same.

FIG. 10 is a flow chart for explaining the procedure of manufacturing various microdevices, such as semiconductor chips (e.g., ICs or LSIs), liquid crystal panels or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 11:
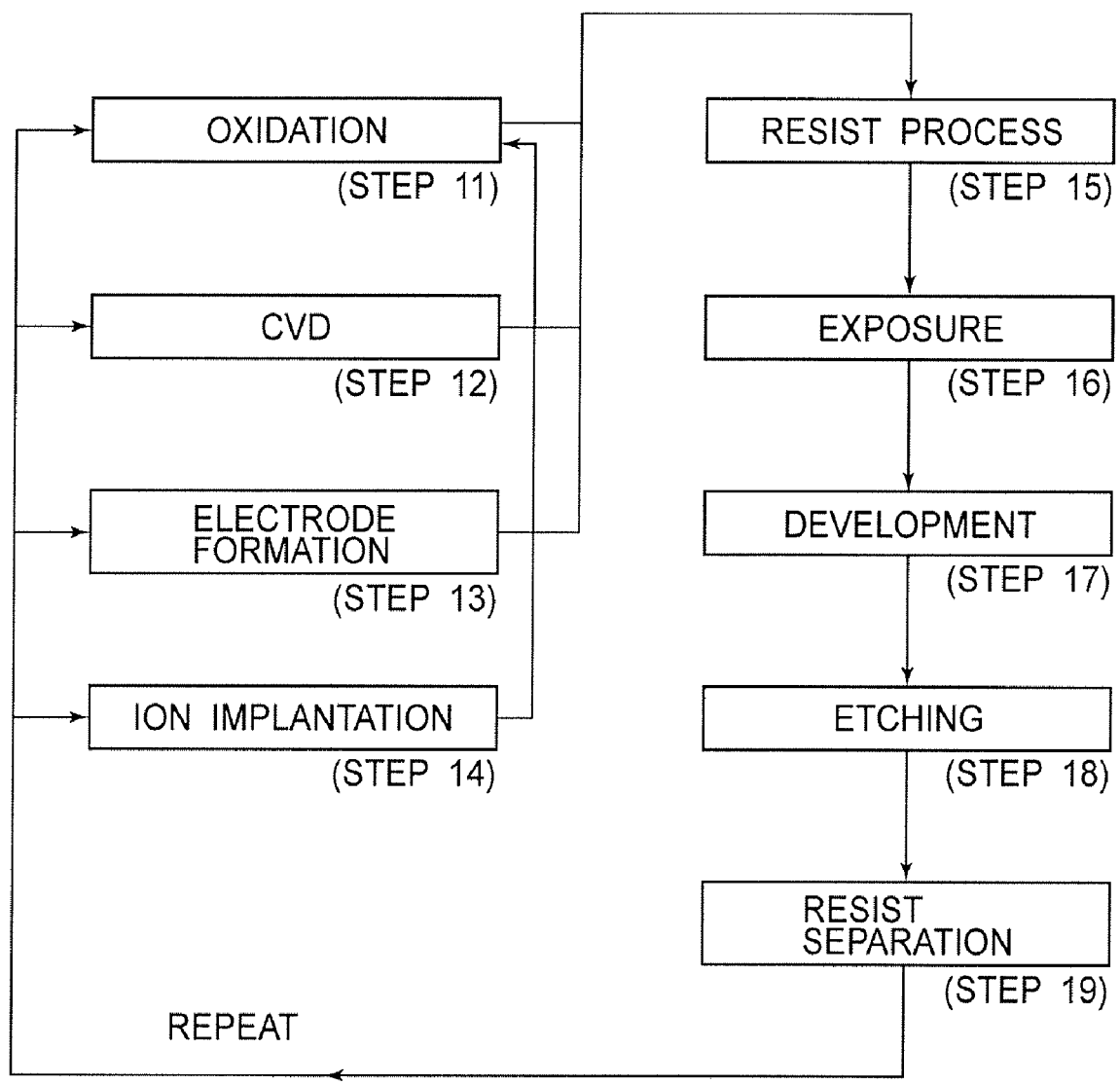
FIG. 11 is a flow chart for explaining details of the wafer process included in Step 4 of the flow chart of FIG. 10.

FIG. 11 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The microdevice manufacturing method according to this embodiment uses an exposure apparatus having a stage device according to any one of the preceding embodiments, by which highest positioning precision of the stage movable portion 11 is assured. Therefore, high-quality microdevices can be produced stably.

While the invention has been described with reference to the structures disclosed herein, it is not confined to the details set forth, and this application is intended to cover such modifications or changes as may come within the purposes of the improvements or the scope of the following claims.

What is claimed is:

1. A stage device comprising:
 a base;
 a stage movable portion including a first stage movable along a surface of said base, and a second stage mounted on said first stage and movable relative to said first stage;
 an interferometer configured to measure a position of said stage movable portion;
 at least one of a piping element and a wiring element connected to said stage movable portion, the at least one of the piping element and the wiring element extending through a space between said first stage and said second stage and outwardly of said stage movable portion;
 a surrounding member covering the at least one of the piping element and the wiring element outside said stage movable portion;
 an exhaustion opening member having an exhaustion opening opposed to the space and connected to said surrounding member; and
 an exhausting system configured to exhaust the space and an inside space of said surrounding member.

2. A stage device according to claim 1, wherein said exhaustion opening member is fixed to said first stage.

3. A stage device according to claim 1, wherein said exhaustion opening member is disposed in a side of said stage movable portion.

4. A stage device according to claim 1, further comprising a plane motor for driving said stage movable portion.

5. An exposure apparatus comprising:
 a stage device as recited in claim 1, which is configured to position a substrate or an original.

6. A method of manufacturing a microdevice, said method comprising:
 a step of exposing a substrate by use of an exposure apparatus as recited in claim 5; and
 a step of developing the exposed substrate to manufacture a microdevice.

7. A stage device comprising:
 a base;
 a stage movable portion being movable along a surface of said base;
 an interferometer configured to measure a position of said stage movable portion;
 a plurality of at least one of piping elements and wiring elements connected to said stage movable portion;

an auxiliary member configured to hold the plurality of the at least one of the piping elements and the wiring elements, said auxiliary member surrounding the plurality of the at least one of the piping elements and the wiring elements and being flexible, to be bent in accordance with the bending of the plurality of the at least one of the piping elements and the wiring elements;

a heat conducting member, different from said auxiliary member, and supported by said auxiliary member and configured to transfer heat along an axial direction of the plurality of the at least one of the piping elements and the wiring elements; and a cooling unit configured to cool the heat transferred from said heat conducting member, the cooling unit being immovable with respect to said base, wherein said heat conducting member includes a plate-like member having a thermal conductivity of at least 10 W/(m·K) in a direction in a plane along the axial direction.

8. A stage device according to claim 7, wherein said heat conducting member has a heat conductivity in the axial direction, which is higher than a heat conductivity in another direction.

9. A stage device according to claim 7, further comprising a plane motor for driving said stage movable portion.

10. A stage device according to claim 7, further comprising:

a surrounding member covering said auxiliary member and said heat conducting member; and an exhausting system configured to exhaust an inside space of said surrounding member.

11. A stage device according to claim 7, further comprising a plurality of the at least one of the piping elements and the wiring elements.

12. An exposure apparatus comprising:

a stage device as recited in claim 7, which is configured to position a substrate or an original.

13. A method of manufacturing a microdevice, said method comprising:

a step of exposing a substrate by use of an exposure apparatus as recited in claim 12; and a step of developing the exposed substrate to manufacture a microdevice.

* * * * *